US012638517B1

(12) United States Patent
    Plank

(10) Patent No.: US 12,638,517 B1
(45) Date of Patent: May 26, 2026

(54) TRAILER CONNECTOR WITH INTEGRATED POWER MONITORING SYSTEM AND RELATED METHODS

(71) Applicant: Matthew Plank, Visalia, CA (US)

(72) Inventor: Matthew Plank, Visalia, CA (US)

(*) Notice: Subject to any disclaimer, the term of this patent is extended or adjusted under 35 U.S.C. 154(b) by 197 days.

(21) Appl. No.: 18/791,232

(22) Filed: Jul. 31, 2024

Related U.S. Application Data

(60) Provisional application No. 63/529,772, filed on Jul. 31, 2023.

(51) Int. Cl.
    *G01R 31/69* (2020.01)
    *B60C 23/04* (2006.01)
    (Continued)

(52) U.S. Cl.
    CPC .......... *G01R 31/69* (2020.01); *B60C 23/0486* (2013.01); *B60D 1/64* (2013.01); *G01L 17/00* (2013.01); *G01R 31/005* (2013.01)

(58) Field of Classification Search
    CPC ...... G01R 31/00; G01R 31/005; G01R 31/50; G01R 31/66; G01R 31/68; G01R 31/69; B60C 23/00; B60C 23/02; B60C 23/04; B60C 23/0486; B60D 1/00; B60D 1/58; B60D 1/62; B60D 1/64; G01L 17/00
    (Continued)

(56) References Cited

U.S. PATENT DOCUMENTS 4,005,313 A * 1/1977 Tibbits ..................... B60D 1/62
                                                          280/422
5,785,532 A   7/1998 Maue et al.
              (Continued)

FOREIGN PATENT DOCUMENTS

CA    3028766 C  * 12/2020  ............... B60D 1/64
DE    4445706 C1 *  5/1996  ............... B60D 1/64
      (Continued)

OTHER PUBLICATIONS

Phillips i-Box, Trailer Wire Management System, Jul. 29, 2016, available online https://phillipsind.com/product-literature.
(Continued)

*Primary Examiner* — Hoai-An D. Nguyen
(74) *Attorney, Agent, or Firm* — Sierra IP Law, PC; William K. Nelson

(57) ABSTRACT

An electrical connector designed for attaching a vehicle's electrical system to the electrical system of a towable trailer. The electrical connector includes a junction box having various electronic systems that are operable and coupled to the distribution lines of the vehicle to the trailer. The electrical connector including an electrical harness on each end of the junction box, with multiple wires connected to the vehicle's electrical system on one end and to the trailer's electrical system on the other end, with each wire corresponding to an electrical load. A protection circuit is integrated to independently safeguard each electrical load within the harness. The system features a sensory circuit capable of monitoring the electrical characteristics of each load, in communication with a controller that includes a processor. The junction box having support for tire pressure monitoring and fleet monitoring of a plurality of vehicles equipped with the junction box.

20 Claims, 15 Drawing Sheets

(51) Int. Cl.
    *B60D 1/64*            (2006.01)
    *G01L 17/00*          (2006.01)
    *G01R 31/00*          (2006.01)

(58) Field of Classification Search
    USPC ........................................ 324/500, 503, 504
    See application file for complete search history.

(56)            References Cited

U.S. PATENT DOCUMENTS

| | | |
|---|---|---|
| 6,273,729 B1 | 8/2001 | Kelly |
| 6,396,380 B1 | 5/2002 | Girke et al. |
| 6,576,838 B2 | 6/2003 | Matsumura |
| 7,095,628 B2 | 8/2006 | Friedrich et al. |
| 7,643,271 B2 | 1/2010 | Phillips et al. |
| 9,434,308 B2 | 9/2016 | Bean |
| 11,345,331 B2 | 5/2022 | McKibben et al. |
| 11,613,216 B2 * | 3/2023 | Ildiz ...................... B60R 16/033 |
| | | 307/91 |
| 2005/0168327 A1 * | 8/2005 | De Wilde ................ B60D 1/62 |
| | | 340/431 |

| | | | |
|---|---|---|---|
| 2006/0085099 A1 * | 4/2006 | Burlak ................. | H01R 31/065 |
| | | | 701/1 |
| 2021/0300311 A1 * | 9/2021 | Brütt ..................... | B60T 13/683 |

FOREIGN PATENT DOCUMENTS

| | | |
|---|---|---|
| EP | 2218147 B1 | 4/2020 |
| KR | 102298542 B1 | 9/2021 |

OTHER PUBLICATIONS

Phillips Permalogic Smart-Charge Trailer Power Management, May 14, 2019, available online https://phillipsind.com/product-literature.
Phillips Qwik-Check, Feb. 20, 2018, available online https://phillipsind.com/product-literature.
Phillips Sta-Dry S7, Nov. 20, 2017, available online https://phillipsind.com/product-literature.
Phillips Volt-Box, Oct. 12, 2016, available online https://phillipsind.com/product-literature.
English Abstract for Foreign Patent KR102298542B1—retrieved online https://patents.google.com/patent/KR102298542B1/en?oq=KR102298542B1.

* cited by examiner

300

301

PROCESSOR 301A 301B

340

POWER MANAGEMENT

350

SENSORY CIRCUIT

360

COMMUNICATION CIRCUIT

365

500

530

531

361

605

TRAILER CONNECTOR WITH INTEGRATED POWER MONITORING SYSTEM AND RELATED METHODS

FIELD OF THE INVENTION

The present invention relates generally to an electrical connector and methods of using the same. More particularly, the present invention provides a connector that is operable to connect a trailer or other towing equipment to a primary vehicle and monitor electrical characteristics between the primary vehicle and the trailer. The present invention further provides a tire pressure monitoring system (TPMS) that is operable to monitor the characteristics of trailer tires and vehicle tires.

BACKGROUND OF THE INVENTION

A trailer connector facilitates the electrical connection between a vehicle and towing equipment with diverse pin connectors. The connector plugs into a vehicle's receiver and contains an electrical socket that provides electrical power and enables control of the trailer's electrical systems such as brake lights and signals, and is commonly used for various towing applications. Adapters may have various configurations (e.g., 4-prong, 7-prong, 12-prong). Standard adapters include receiver hitch, ball mount, wiring, weight distribution, and multi-purpose ones, offering compatibility with different trailers and wiring functions. Trailers can have different wiring configurations according to their equipment, often in a 7-pin configuration for controls or 4 or 5-pin variants. In Europe, 13-pin and 7-pin configurations are common.

However, these adapters often face durability issues in the contacts, leading to circuit malfunctions, which cause hazardous driving conditions.

Existing solutions include plug-and-play adapters, vehicle harnesses, and wireless hitch adapters. Plug-and-play options, usually with 7-pin, 4-pin, or 5-pin adapters, are simple to install but may not support all trailer functions. Vehicle harnesses offer reliable connections but are vehicle-specific. None of these methods provide feedback to the driver about wire failures or have universal attachment capabilities.

Traditional trailer connectors also fail to monitor electrical signals or connections between the trailer and the vehicle. Solutions such as fuses have been used to protect the connections, but the driver may not know if their brake lights or tail lights fail to operate when in the cabin. Therefore, having a trailer protection system operable to monitor electrical characteristics is beneficial, thereby signaling the driver to a fault. Thus, if the trailer protection system detects faults, the driver may be alerted to the issue and take appropriate action by adjusting the connection or replacing the cable.

Existing solutions in this area also fail to integrate tire monitoring within a single system. For example, it may be useful to include a tire monitoring system within the same system, providing power performance monitoring for trailer drivers traveling long distances.

The proposed invention aims to rectify these shortcomings of existing trailer connectors.

SUMMARY OF THE INVENTION

The present invention provides an electrical connector that is operable to electrically connect trailer electronic circuits to a vehicle's electronics system. The connector may enable the control of trailer equipment and power systems. The trailer electronic circuits may be routed to trailer functions, such as turn signals, brake lights, and electrical power to various trailer systems.

In some embodiments, the electrical connector may be designed as a junction box. The junction box may be operably positioned in an easily accessible location between the trailer and the vehicle. The junction box may be operable to secure an electronic failure prevention system and a controller board. In some embodiments, the vehicle wiring may be incorporated inside the junction box where each connection is secured with a pin adapter connected to a harness. The pin adapter may be a vehicle plug in most embodiments. The junction box may also be in communication with a tire pressure monitoring system operably incorporated within the tires of the trailer and the vehicle and a receiver system operably incorporated on the dashboard of a vehicle.

The electrical connector of the present invention may include an electronic failure prevention system operable to protect the connections between the trailer and the vehicle. Connections between the trailer and the vehicle may include those similar to that of a 7-pin adapter. For example, pins may include ground, tail or running lights, left turn, right turn, brake lights, electric brakes, reverse lights, and auxiliary power. There may be a harness in electrical communication with the vehicle, trailer, and failure prevention system. The electronic failure prevention system may be attached to a harness, where the harness may include a plurality of terminals operable to be monitored by the same electronic failure prevention system.

In some embodiments, the electronic failure prevention system may protect the connections between the primary vehicle and trailer using fuse blocks. Such fuse blocks may be placed in line with each connection to protect circuits from current overload. For example, the number of fuse blocks used within the electronic failure prevention system may range between 4 to 12 in most embodiments. In other embodiments, there may be a different number of fuse blocks.

In some embodiments, the inline fuse connected to a single pin within the short fuse block is operable to blow (e.g., sever, open circuit) when the current in the individual circuit exceeds a certain amount, effectively shutting off and protecting the circuit. In some embodiments, a plurality of inline fuses forming a fuse array may be provided within the short fuse block, where each inline fuse may provide protection to a single wiring connection from a primary vehicle to the trailer wiring. As such, each inline fuse in the array may blow when the current from a corresponding circuit exceeds a certain amount, thereby, shutting off and protecting the individual circuits in the array.

In most embodiments, the pin adapter may be operable to adapt a traditional 7-pin adapter towards a 4-pin configuration. For example, most vehicles may implement a 7-pin electrical configuration, but many trailers may have a 4-pin configuration. Therefore, the pin adapter may be operable to adapt the trailer connector to function as a 4-pin configuration, thereby providing a system for monitoring electrical characteristics for the same configuration. In such embodiments, the additional pins may be unconnected or left floating and do not affect the operation of the system.

In some embodiments, the pin adapter may include a single pin connection with an inline fuse or breaker that is operable to protect the individual circuit connected to the same pin. In other embodiments, there may be a plurality of pin connections with a plurality of inline fuses operable to protect each of the plurality of individual circuits connected to each plurality of pin connections.

In some embodiments, there may be a first controller board housed within the trailer junction box that is in communication with a receiver/display board located in the dashboard of the primary vehicle. Each board may include logic circuitry that is equipped on a printed circuit board (PCB). In such embodiments, the receiver/display module in the dashboard of the primary vehicle may include a digital display. In other embodiments, the receiver/display module may be integrated within the infotainment screen of the vehicle.

The controller board of the present invention may operably incorporate a sensory circuit and a processor operable to measure the electrical characteristics of loads between a vehicle and a trailer. Some examples of electrical characteristics may include voltage, current, and signal integrity measurements.

In some embodiments, the sensory circuit may include a current monitoring system and a voltage monitoring system, each system being operably in communication with the processor of the controller board. The controller board may operably obtain electrical characteristics from the two systems.

In some embodiments, the controller board of the present invention may be in communication with a TPMS system operable to measure the characteristics of a vehicle or trailer tire.

In some embodiments, there may be a receiver board operably in communication with the controller board. The receiver board may include a processor, display module, and LED array. The receiver board may be placed on the dashboard of the primary vehicle or may be integrated within the infotainment system of the vehicle, as well as a phone application.

The processor of the receiver board may act as a receiver in wireless communication with the processor of the controller board. In such embodiments, the receiver board is operably in wireless communication with the controller board and is operable to receive a plurality of electrical characteristics from the controller board. Wireless communication may be established using Bluetooth, WiFi, or Zigbee communication protocols.

The receiver board may be operable to illustrate electrical characteristics on a display module operably in electrical communication with the processor. The display module of the receiver board may include a graphical user interface that may be operably interactable by a user using the electrical connector and monitoring system.

The digital display housed within the receiving/display module may be operable to indicate the status of loads connected between the vehicle and trailer plugs. In some embodiments, the status of loads from the vehicle or trailer plug may be indicated by a light emitting diode (LED) array. In other embodiments, the status of pin connections may be indicated by color code markers on the digital display.

In some embodiments, the receiver board may be in electrical communication with an LED array. In such embodiments, the LED array may be arranged in a horizontal configuration with a specified number of LEDs. In other embodiments, the LED array may be arranged in a grid configuration. In some embodiments, there may be at least seven LEDs within the LED array. In other embodiments, there may be any number of LEDs between four and thirteen placed within the LED array.

In some embodiments, each LED within the LED array may have different colors and may be arranged using various patterns or configurations to generate different color effects. In some embodiments, the LED array may consist of RGB LEDs, Bi-color LEDs, Quad-color LEDs, or a combination of colored LEDs operable to generate a variety of color effects. In some embodiments, the LED array may consist of other types of LEDs. In other embodiments, the LED array may consist of a combination of several LED types.

In some embodiments, the controller board may be in communication with a tire monitoring system operable to measure the air pressure inside the tires of both vehicle and trailer. The tire monitoring system may include a plurality of tire pressure sensors operable to measure the performance characteristics of each tire on the vehicle and the trailer.

The tire pressure sensor may include a processor operable to process the performance characteristics collected by the sensor and transmit the characteristics wirelessly to the tire monitoring system. A battery may be used to power each tire pressure sensor. Examples of performance characteristics measurable by the pressure sensor may include tire pressure, tire temperature, and sensor battery life.

Each tire pressure sensor may be operable to send tire performance characteristics. The performance characteristics broadcasted by the tire pressure sensor may be formatted using binary representation, and in most cases may be represented as a hexadecimal string. The length of the performance characteristics may range between 15 and 25 bytes in some exemplary embodiments.

In some embodiments, the tire pressure monitoring system may send the performance characteristics to the controller board, thereby displaying the data on the receiver board. In other embodiments, the controller board may be bypassed and the performance characteristics may be directly sent to the receiver board.

The tire monitoring system may provide real time information on tire pressures to the driver of the vehicle. In other embodiments, the tire pressure sensor may communicate with the vehicle's onboard diagnostic system.

In some embodiments, the tire pressure sensor may be placed over the wheel's valve stem. In other embodiments, the tire pressure sensor may be placed within the vehicle tire such that accurate readings are obtained.

It is an aspect of the present invention to provide an electrical connector having an integrating a power management system and connector for a trailer to a vehicle, the electrical connector may include a primary electronic system connected between a vehicle and a trailer, the primary electronic system having a plurality of pins that are electrically connected to a vehicle's electrical wiring, and a plurality of fuses within a fuse block connected to a trailer plug connected to the vehicle electrical wiring, where the plurality of pins are each connected to a plurality of corresponding fuses within the fuse block; a secondary electronic system in electrical communication with the primary electronic system, the primary electronic system may have a transmitter, a processor, and a sensory circuit that may be operable to monitor a plurality of electrical characteristics of the plurality of pins; and a receiver having a display module, in communication with the transmitter, and operable to receive the plurality of electrical characteristics. The primary electronic system and secondary electronic system may be connected between a vehicle and a trailer and may be operable to independently monitor the electrical characteristics of a load corresponding to each pin in the plurality of pins.

In a further aspect the electrical connector may additionally include a tire pressure monitoring system that may be in communication with the secondary electronic system, the tire pressure monitoring system including a plurality of tire pressure sensors, each having a processor, a battery, and an antenna; and a tire pressure module in communication with the processor that may be operable to collect performance characteristics of the corresponding tire. Each fuse in the plurality of fuses may be operable to blow if the current within a pin of the plurality of pins exceeds a predetermined threshold. A plurality of electrical characteristics may include current measurements between the plurality of pins and the trailer plug and voltage measurements at the plurality of pins. The electrical connector may additionally include a voltage monitoring system that may be operable to measure the voltage at the plurality of pins and a current monitoring system operable to measure the current between the plurality of pins and the trailer plug, each after sampling a plurality of time samples and each reading being transmitted between the transmitter to the receiver. The display module may include a graphical user interface operable to receive input from a user of the trailer hitch adapter, wherein the graphical user interface is configurable to display the plurality of electrical characteristics. The tire pressure management system performance characteristics may include tire pressure data, tire temperature data, and sensor battery life. The secondary electronic system may include a SIM card that may be operable to transmit data via a cellular network, and may be in communication with a mobile application operating on a client device (e.g., cellphone, remote computer) or a remote server. Finally, the secondary electronic system may be in communication with a fleet monitoring system operable to monitor the plurality of electrical characteristics for a plurality of primary electronic systems connected between a plurality of vehicles and a plurality of trailers using the remote server.

It is another aspect of the present invention to provide a method of monitoring the electrical connection between a vehicle and a trailer, that may include inserting a vehicle plug of an electrical connector into a vehicle receptacle, the vehicle plug may have a plurality of pins connected to a junction box which has a controller board that may include a processor and antenna, a protection circuit, and a sensory circuit having a current monitoring system and a voltage monitoring system, the sensory circuit may be in electrical communication with the controller board; inserting a trailer plug of the electrical connector into a trailer receptacle, the trailer plug having a plurality of pins connected to the junction box, wherein each pin corresponds to a function on the trailer; placing a receiver board in the cabin of the vehicle, the receiver board including a processor and a display module having a graphical user interface; and establishing a wireless connection between the receiver board and the controller board. The processor may be operable to establish the wireless connection using a transmission module. The controller board may be in communication with a mobile application operating on a client device. The plurality of electrical characteristics may include current readings and voltage readings, each reading generated by sampling over a plurality of time samples.

It is another aspect of the claimed invention to provide a junction box that is configured to attach a trailer electrical system to a vehicle electrical system may include a harness having a plurality of wires connected to a vehicle electrical system on a first end and connected to a trailer electrical system on a second end, wherein each of the wires corresponds to an electrical load; a protection circuit operable to independently protect each electrical load in the harness; a sensory circuit operable to monitor electrical characteristics of each electrical load independently, the sensory circuit further in communication with a controller having a processor; and a receiver in wireless communication with the controller, the receiver including a display and graphical user interface that is operable to display the electrical characteristics, wherein the harness is in electrical communication with a fuse block and the processor is operable to communicate with the sensory circuit and the sensory circuit is operable to monitor electrical characteristics at the harness, and the controller is operable to send the electrical characteristics to the receiver using a wireless communication protocol. The junction box may further include a tire pressure monitoring system in communication with the controller, the tire pressure monitoring system including a plurality of tire pressure sensors, each having a processor, a battery, and an antenna, wherein the controller includes a tire pressure module in communication with the sensor processor that is operable to collect performance characteristics of the corresponding tire. The electrical characteristics may include current measurements. The receiver may be in electrical communication with a remote server. The server may be in communication with a fleet management system that is operable to monitor a plurality of junction boxes equipped to a plurality of vehicles.

Further aspects and embodiments will be apparent to those having skill in the art from the description and disclosure provided herein.

Therefore, it is an object of the present invention to provide an electrical connector and monitoring system that is operable to monitor the electrical characteristics of the loads between the vehicle plug and the trailer plug.

It is another object of the present invention to provide an electrical connector and monitoring system operably incorporating a tire pressure monitoring system operable to monitor the performance characteristics of the tires within a vehicle and trailer.

It is another object of the present invention to provide an electrical connector and monitoring system operable to provide a secure electrical connection between a vehicle and a trailer.

It is an object of the present invention to provide a system for alerting drivers of electrical faults between a vehicle and trailer whilst using the trailer hitch adapter.

The above-described objects, advantages, and features of the invention, together with the organization and manner of operation thereof, will become apparent from the following detailed description when taken in conjunction with the accompanying drawings, wherein like elements have like numerals throughout the several drawings described herein. Further benefits and other advantages of the present invention will become readily apparent from the detailed description of the preferred embodiments.

DETAILED DESCRIPTION

Figure 1:
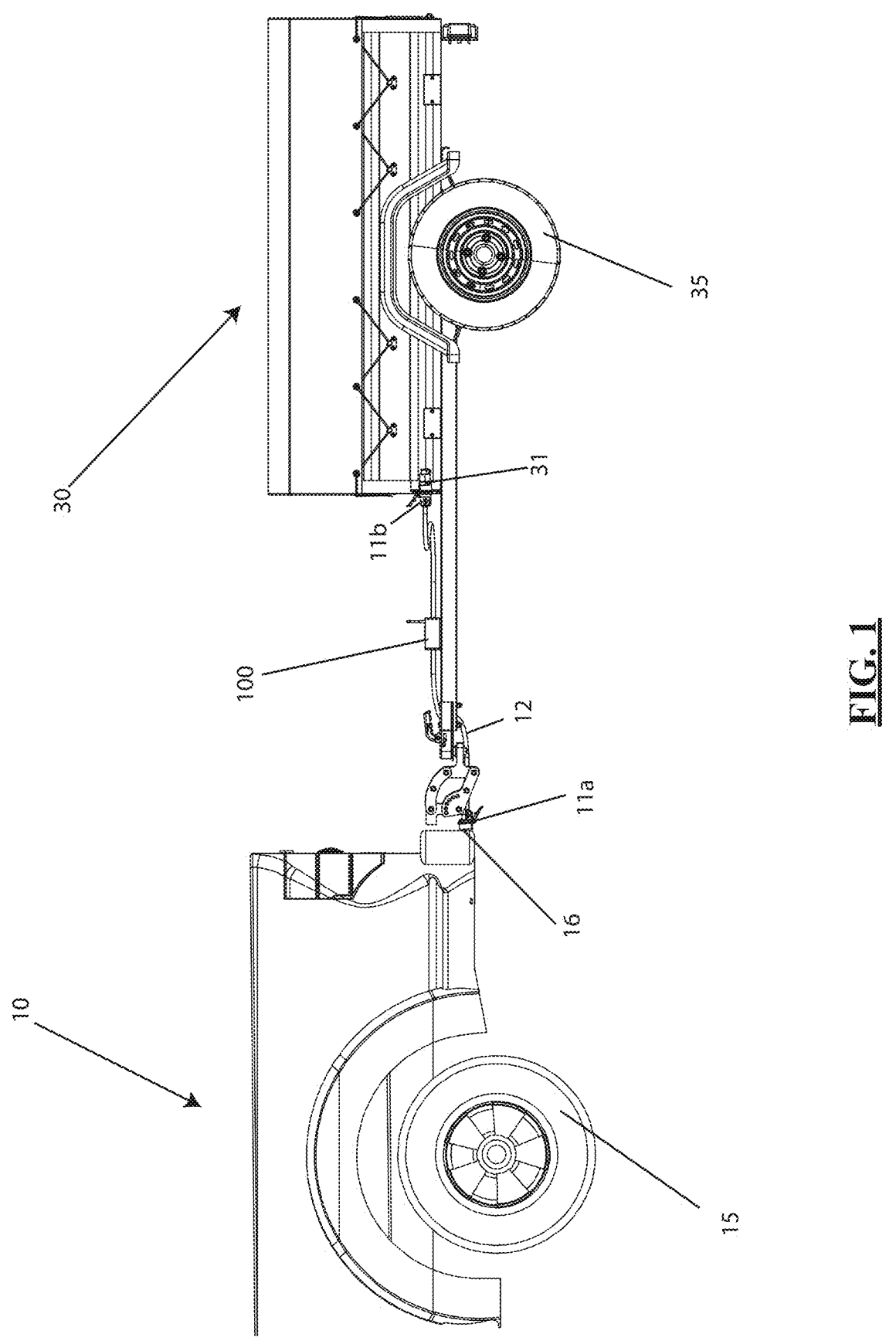
FIG. 1 provides an environmental view of the electrical connector coupled to a vehicle and a trailer, according to an embodiment of the present invention.

Reference will now be made in detail to certain embodiments of the invention, examples of which are illustrated in the accompanying drawings. While the invention will be described in reference to these embodiments, it will be understood that they are not intended to limit the invention. To the contrary, the invention is intended to cover alternatives, modifications, and equivalents that are included within the spirit and scope of the invention. In the following disclosure, specific details are given to provide a thorough understanding of the invention. However, it will be apparent to one skilled in the art that the present invention may be practiced without all of the specific details provided.

Referring to the drawings, wherein like reference characters designate like or corresponding parts throughout the several views, and referring particularly to FIGS. 1-15, it is seen that the present invention includes various embodiments of a trailer connector system that includes a primary electrical coupling that provides electric power and controls from a vehicle to a towable trailer electrical system.

Figures 2A, 2B:
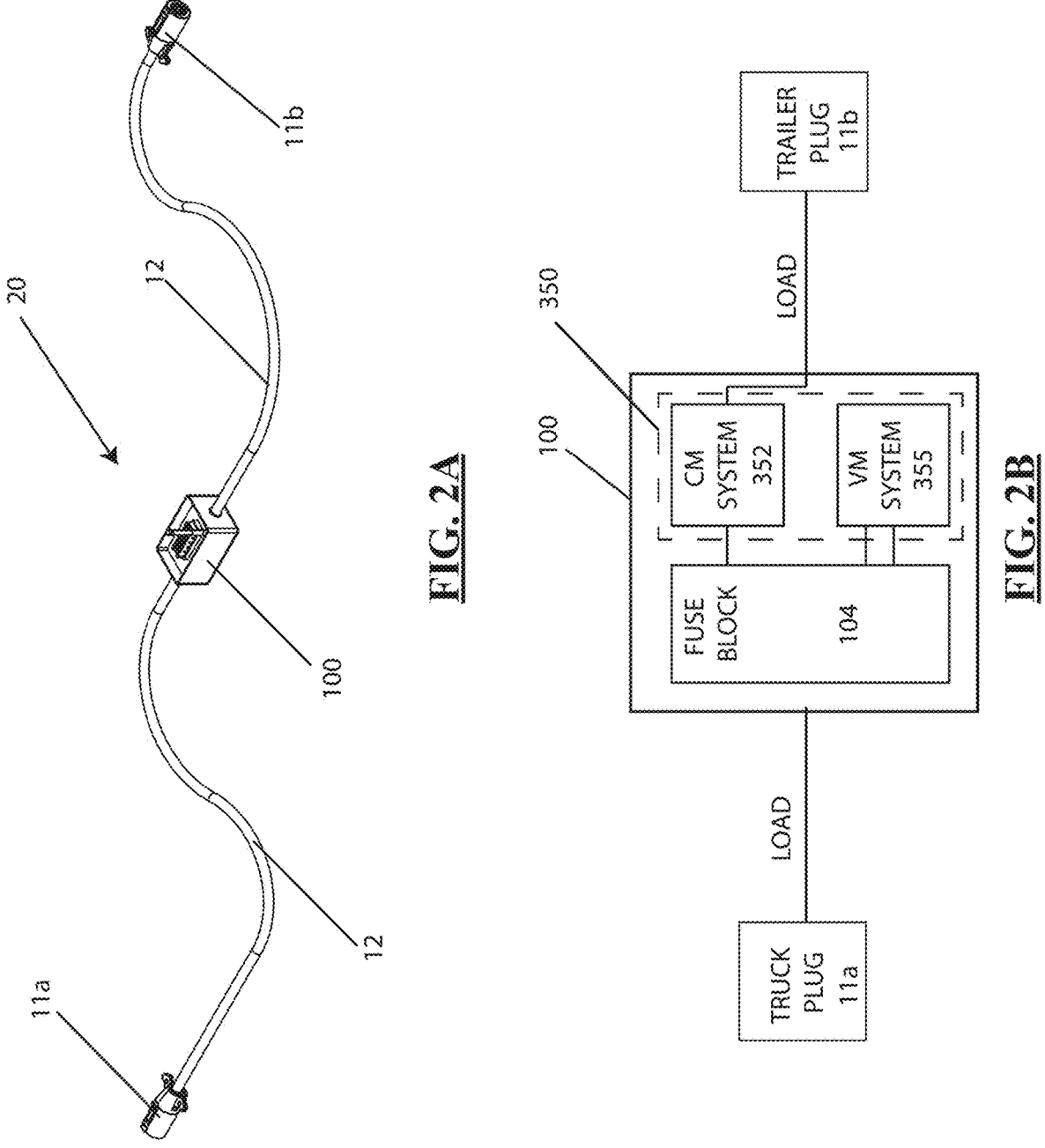
FIG. 2A provides an illustration of the electrical connector, according to an embodiment of the present invention.
FIG. 2B provides a diagram of the junction box, according to an embodiment of the present invention.

The electrical connector 20 of the present invention is provided as a wire harness 12 having a truck plug 11*a* on a first end and a trailer plug 11*b* on a second end of the harness with a junction box 100 between, as best illustrated in the close up view in FIG. 2A. The electrical connector 20 is operable to connect the electrical system of a trailer 30 to the electrical system of a vehicle by connecting the truck plug 11*a* into a vehicle receptacle 16 and the trailer plug 11*b* to the trailer receptacle 31, as shown in FIG. 1. The junction box 100 may be operable to receive a plurality of electrical wires corresponding to each wire from the truck 10 to the trailer 30 where each wire corresponds to a pin in the plug.

The junction box 100 may also contain a fuse block 104 and a sensory circuit 350, both being electrically connected to the same load. The load may travel first from the fuse block 104 towards a current monitoring system 352, which is in electrical communication with trailer plug 11*b*. Also in electrical communication with the load is a voltage monitoring system 355. In such embodiments, the current monitoring system 352 may be placed in series with the load, and the voltage monitoring system 355 may be placed in parallel with the load.

In some embodiments, truck plug 11*a* may include a plurality of pins, with each pin representing a specific load from the vehicle 10. In most embodiments, there may be at least 7 pins within the truck plug 11*a*. Examples of electrical loads may include brake lights, tail lights, left turn signals, right turn signals, and the like.

Figure 3:
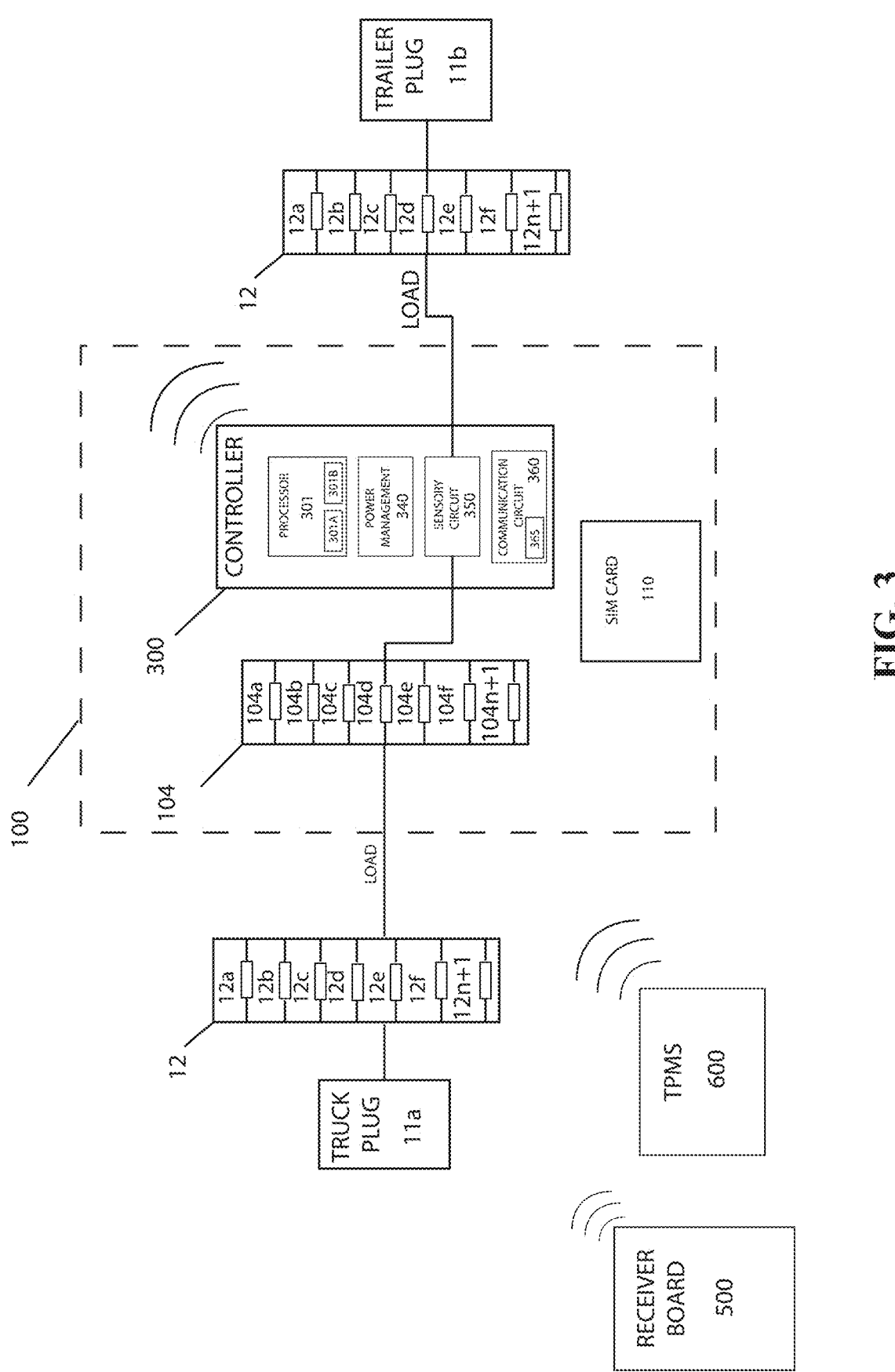
FIG. 3 provides an illustration of the junction box, according to an embodiment of the present invention.
Figure 4:
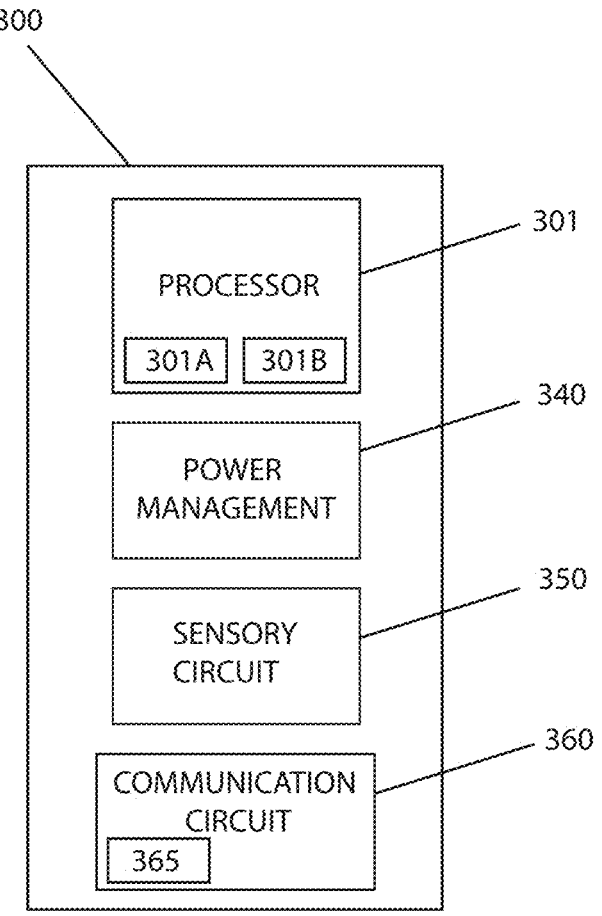
FIG. 4 provides an illustration of the controller board, according to an embodiment of the present invention.

In some embodiments, the junction box 100 is operably in communication with a receiver board 500 and a tire pressure monitoring system 600, as shown in FIG. 3.

In some embodiments, the primary vehicle 10 may consist of a passenger car, semi-trailer truck, dump truck, or flatbed truck. Examples of trailer 35 may consist of toy haulers, cargo trailers, utility trailers, travel trailers, boat trailers, livestock trailers, semi-truck trailers, and the like.

In some embodiments, the trailer 30 may use a plug 11*b* with at least 4 pins. In such embodiments, the truck plug 16 may be operably connected to junction box 100 through a harness. The junction box 100 may be operable to map out the necessary pins required for the trailer 30 using a controller board 300. The controller board 300 may be operable to ignore or bypass functions not used by the 4-pin configuration in trailer plug 11*b*. In such embodiments, the functions not used by the 4-pin configuration may be left floating, and the operation of the junction box 100 remains uninterrupted.

In other embodiments, there may be an adapter (not shown) operable to map out the pins for a truck plug 11*b* with a 4-pin configuration when connected to a trailer plug 11*a* with a 7-pin configuration.

Vehicle 10 may be operable to receive truck plug 11*a*. For example, in most embodiments, there may be a receptacle 16 on the vehicle 10 that is operable to receive a truck plug 11*a*. The receptacle 16 may include at least seven wires, each operably representing a load. Therefore, pins within plug 11*a* may be operable to electrically connect with the wires within receptacle 16.

In some embodiments, the pins within truck plug 11*a* and the pins from vehicle receptacle 16 may be electrically connected through several methods. Examples of some methods may soldering, crimping, welding, and the like. The trailer plug 11*b* and trailer receptacle 31 may be electrically connected using methods similar to those described above.

In some embodiments, there may be a fuse block 104 operable to receive a load from truck plug 11*a*. Fuse block 104 may be a plurality of inline fuses or breakers operable to protect the circuits connected to each pin traveling from input terminals 101. In a 7-pin configuration, there may be at least six inline fuses 104A-F within fuse block 104 operable to protect at least six circuits. In other embodiments, there may be a different number of inline fuses within fuse block 104 that are operable to protect a plurality of loads traveling from vehicle plug 11. It is to be appreciated that each load is a wire in the harness 12 corresponding to a wire from the vehicle to the trailer 30, and that the number of fuse blocks 104 in the junction box 100 is scalable and a fuse block 104 may be provided for each load in the electrical connector 20.

Inline fuses within fuse block 104 may be operable to blow when currents within loads connected to each pin exceed a certain amount. Therefore, the circuit is effectively shut off and is protected from overcurrent and further damage. In such embodiments, a plurality of inline fuses may form a fuse array within fuse block 104, each inline fuse being operable to protect a single load traveling in between truck plug 11*a* and trailer plug 11*b*. Therefore, the fuse block 104 may be operable to protect the junction box 100 and the trailer 30 from further damage.

Examples of inline fuses within fuse block 104 may include automotive fuses, axial lead fuses, blade terminal and special purpose, cable fuse in line, cartridge fuse, ceramic fuse, DC Power distribution fuse, dummy fuse, fast-acting fuse, glass tube, high-speed fuse, liquid fuse, medium voltage fuse, PCB fuse, semiconductor fuse, terminal fuse, and time delay fuse. Each of the previously stated fuses is available in a wide range of sizes, wiring configurations, and power/voltage ratings.

Controller Board

In some embodiments, the junction box 100 may include a controller board 300, operably in electrical communication with sensory circuit 350.

The controller board 300, as shown in FIG. 3, may include a processor 301, power management system 340, sensory circuit 350, and a communication circuit 360. In some embodiments, the power management system 340 may be operable to power the controller board 300, the sensory circuit 350 may be operable to monitor electrical characteristics within loads traveling from fuse block 104, and the communication circuit 360 may be operable to establish a wireless connection with receiver board 500 using an antenna 365 in communication with processor 301. Examples of wireless communication provided by the communication circuit 360 may include Wi-Fi, Bluetooth, Zigbee, LoRa, NFC, RFID, Cellular, and the like.

The processor 301 may be operable to execute program instructions 301B stored within memory 301A. Program instructions 301B may include a plurality of software modules operable to perform tasks such as Bluetooth communication, and power monitoring. These modules may include a transmission module 361, a LED module 401, a pressure monitoring module 605, and a fleet monitoring module 1005, shown in FIG. 15.

The sensory circuit 350 may be operable to monitor the electrical characteristics of individual loads traveling between vehicle 10 and trailer 30. More specifically, the sensory circuit 350 is operable to independently determine a plurality of electrical characteristics 330 for each load in the harness 12 between vehicle 10 and trailer 30.

Figure 9:
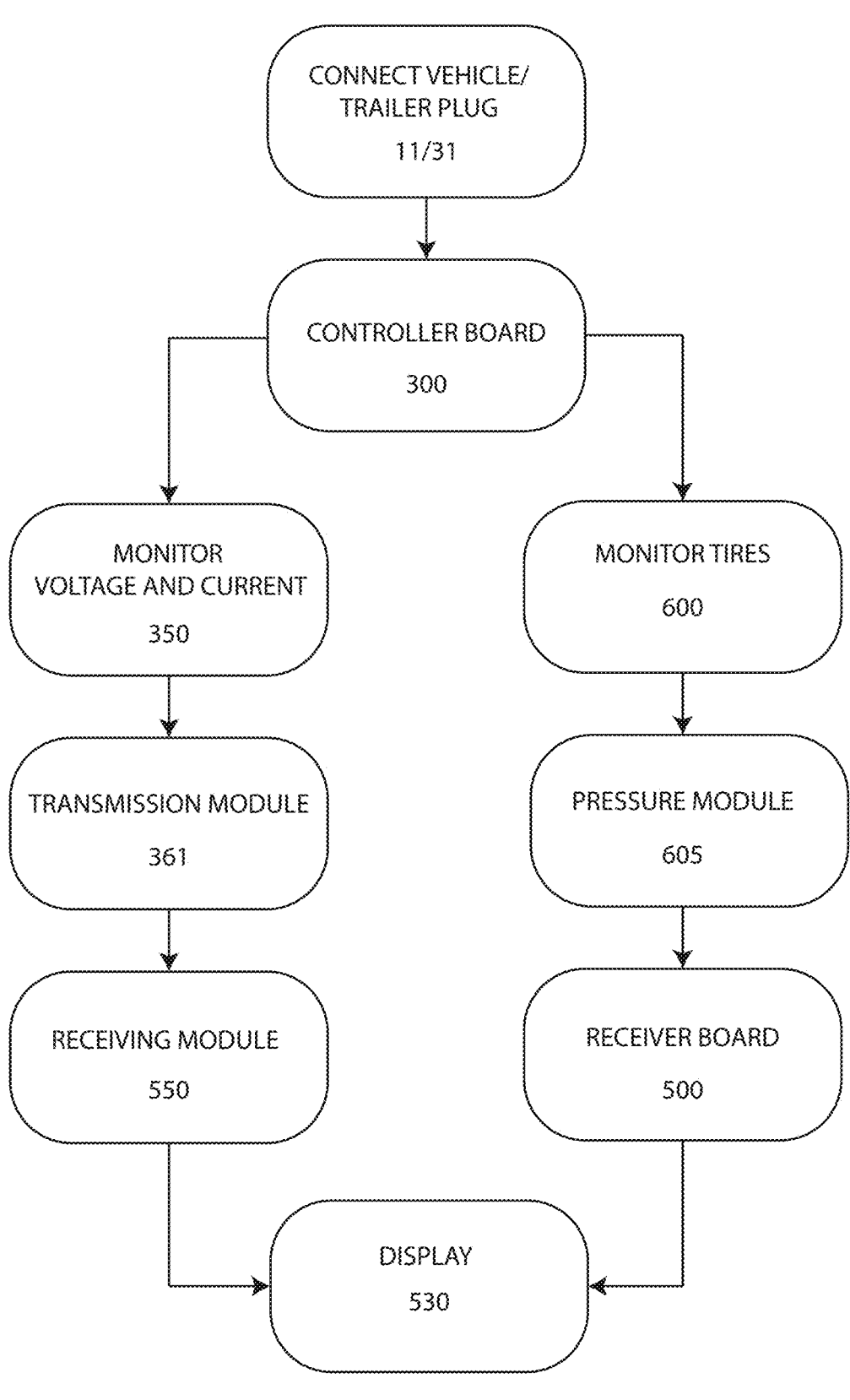
FIG. 9 provides a first flow diagram of the electrical connector and monitoring system, according to an embodiment of the present invention.
Figure 12:
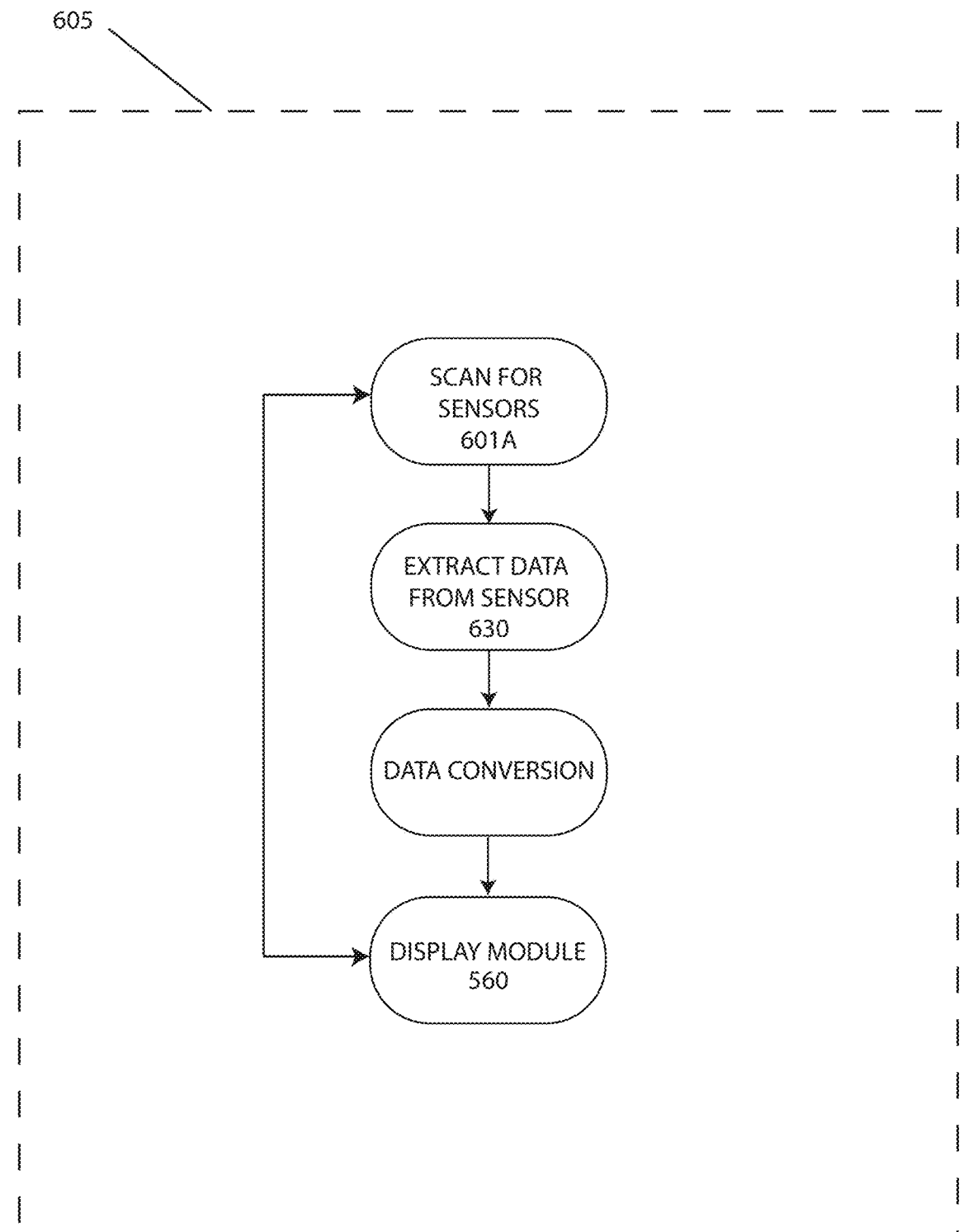
FIG. 12 provides a fourth flow diagram of the electrical connector and monitoring system, according to an embodiment of the present invention.

As shown in FIG. 9, the controller board 300 may be operably in communication with both the sensory circuit 350 (e.g., Monitor voltage and current) and the TPMS system 600 (e.g., Monitor Tires). The sensory circuit 350 may be operably in communication with the transmission module 361 to obtain electrical characteristics 330 and send them towards receiver board 500. The TPMS system 600 may be in communication with a pressure module 605 operable to obtain tire characteristics 630 and send them towards receiver board 500, as shown in FIG. 12. The receiver board 500 may be in electrical communication with a display 530 operable to illustrate electrical characteristics 330 and tire characteristics 630. In some embodiments, the pressure module 605 may communicate with the transmission module 361 and is operable to send the tire pressure characteristics (e.g., Pressure, Temperature, etc.) to the receiver board 500.

In some exemplary embodiments, the controller board 300 may include a SIM card 110 operable to increase the range of wireless communication. More specifically, the SIM card 110 within the controller board 300 may allow for communication with a fleet monitoring system 1000, or for increased range of communication with a receiver board 500, a mobile platform 800, and the like. In some embodiments, a repeater (not shown) may be incorporated into the trailer 30 and may be operable to boost the signal from the individual sensors (610A-610F) in the TPMS system to the controller board.

Figure 7:
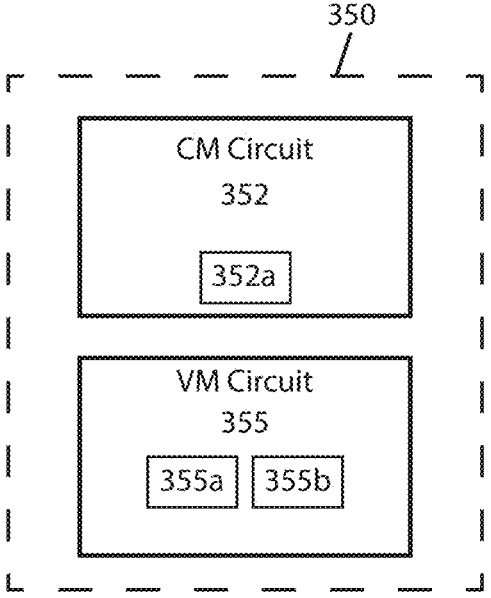
FIG. 7 provides an illustration of a circuit within the electrical connector, according to an embodiment of the present invention.

In some embodiments, the sensory circuit 350 may include a voltage monitoring system 355 and a current monitoring system 352 operable to measure the voltage and current of each load, as shown in FIG. 7. Therefore, the sensory circuit 350 is operable to measure the status of the loads (e.g. vehicle functions) between the vehicle 10 and trailer 30. The sensory circuit 350 may be operable to obtain a plurality of electrical characteristics 330 from the voltage monitoring system 355 and the current monitoring system 352. In other embodiments, the sensory circuit 350 may contain only the voltage monitoring system 355 or only the current monitoring system 352, rather than both systems.

Current monitoring system 352 may be operable to independently measure the current of each load within the harness 12. In some embodiments, the current monitoring system 352 may include a plurality of current sensors 352*a* positioned in an array like structure operable to detect and measure the current of each load. Examples of current sensors 352*a* may include, but are not limited to, Hall effect sensors, shunt resistors, or current transformers, each providing accurate and reliable current measurements. Current sensors 352*a* may be powered through power management system 340.

Current for each load within harness 12 may be measured by first connecting a load in series between the fuse block 104 and the trailer plug 11*b*. For example, the current sensor 352*a* may be operable to receive at least two inputs, one representing the first point of the load where current is measured, and a second point of the load in series with the first point. The measured current between the first and second points may then flow through sensor 352*a*, thereby allowing the sensor 352*a* to generate a magnetic field proportional to the current. A hall effect sensor 352*b* in communication with the sensor may convert the magnetic field to a voltage signal, which is then interpreted by the controller board 300.

In such embodiments, the first point of the load may be positioned in between the fuse block 104 and the current monitoring system 352, and the second point of the load may be positioned in between the current monitoring system 352 and the trailer plug 11*b*.

In other embodiments, the current monitoring system 352 may use other methods to measure current across a load within harness 12. Examples of other methods may include shunt resistor measurements, Rogowski coils, current transformers, optical fiber sensors, clamp meters, and the like.

In some exemplary embodiments, the current monitoring system 352 may be operable to determine if a 4-pin trailer plug 11*b* configuration is used. For example, the current monitoring system 352 may first communicate with the controller board 300 and determine which pins are unused. Therefore, the unused pins may remain floating and the system 352 may operate as normal.

In some embodiments, the current monitoring system 352 may include a plurality of current sensors 352a, each being independently operable to measure current across a plurality of loads within harness 12.

As shown in FIG. 2B, a single load is illustrated for simplicity, the voltage monitoring system 355 may be operable to measure the voltages of a single load, thereby determining if a short circuit has occurred. The voltage of a load may be measured in parallel to the direction of current. For example, the voltage of a particular load may be measured by positioning a first wire at the first point and a second wire at a second point, where both the first wire and second wire are placed at a measurement location. Voltage across a load may be measured at fuse block 104, thereby determining if a short circuit occurred prior to electrically connecting junction box 100 towards trailer plug 11b with harness 12.

The voltage monitoring system 355 may include a plurality of electronic components operable to measure the voltage of a single load within harness 12. As shown in FIG. 7, the electronic components may include a zener diode 355a, comparator 355b and light-emitting diode (LED) array 400. A zener diode 355a is selected for an appropriate voltage according to the vehicle's voltage rating and works in conjunction with the comparator 355b to determine if the terminals are operating as normal. The comparator 355b is operable to compare the voltage at the load to the voltage of the zener diode 355a. In some embodiments, processor 301 is operable to work in conjunction with the sensory circuit 350 to determine the voltages of a single load. The appropriate voltage for the zener diode may range between 12-24V, depending on the primary vehicle's 10 configuration. For example, some commercial trucks and heavy-duty vehicles operate on 24 V systems, whereas passenger cars typically use 12 V electrical systems. In some embodiments, the voltage monitoring system 355 may include a plurality of comparators 355b, zener diodes 355a operable to measure the voltage across a plurality of loads within harness 12.

In other embodiments, the voltage monitoring system 355 may use other methods to measure voltage across a load within harness 12. Examples of other methods of measuring voltage may include the capacitive coupling effect, electromagnetic induction, voltage dividers, optical voltage measurement, differential amplifiers, Wheatstone bridge, and the like.

Figure 10:
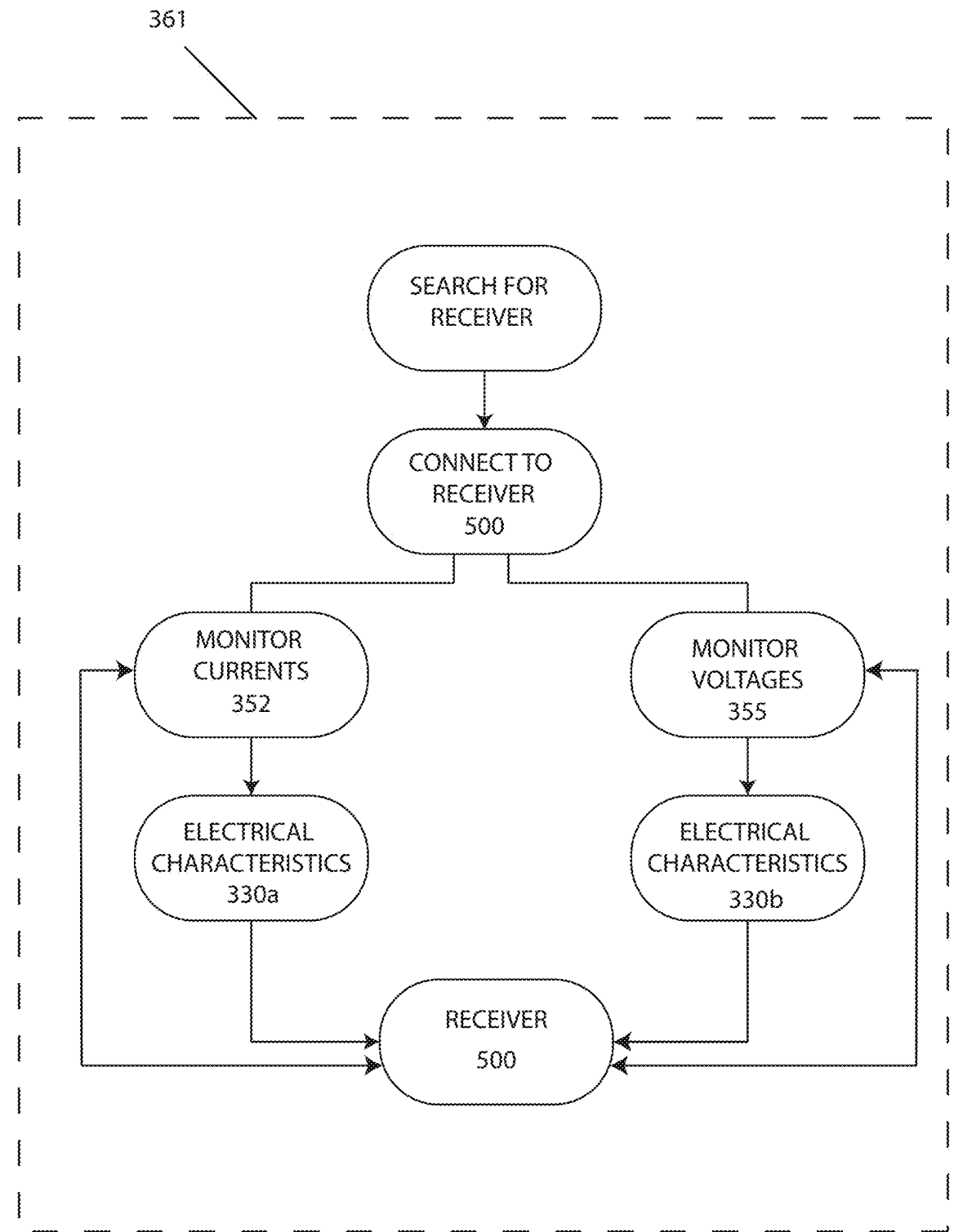
FIG. 10 provides a second flow diagram of the electrical connector and monitoring system, according to an embodiment of the present invention.

In some embodiments, a transmission module 361 may be in communication with the sensory circuit 350, as shown in FIG. 10. Therefore, the transmission module may be operable to obtain electrical characteristics 330 from the sensory circuit 330. The transmission module 361 may be further operable to enable communication between controller board 300 and receiver board 500 using wireless communication methods, as shown in FIG. 9. More specifically, the transmission module 361 searches for the receiver board 500 and establishes a wireless connection. Once connected, the transmission module 361 may retrieve electrical characteristics from sensory circuit 350. For example, the transmission module 361 may send the electrical characteristics to the receiver board 500 for further processing. In such embodiments, the receiver board 500 may include a receiving module 550 operable to receive instructions from transmission module 361.

In some embodiments, electrical characteristics 330 may include a plurality of current readings 330a and a plurality of voltage readings 330b. Each reading 330a or 330b may represent an individual current or voltage measured between or across a load. Readings 330a or 330b may be sampled over a predetermined number of intervals, allowing for an accurate measurement of the current or voltage of the load. Examples of intervals may include 5, 10, 15, 20, 50, 100, 500, and the like.

Receiver Board

Figure 5:
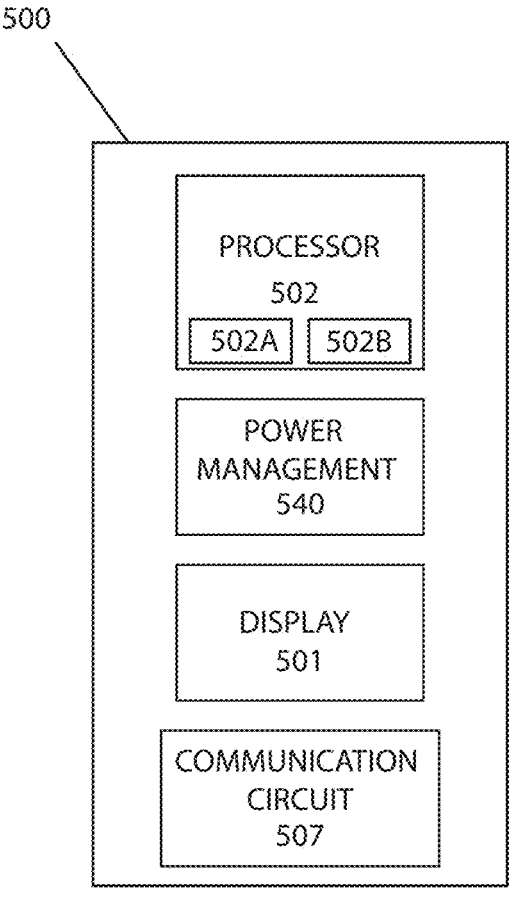
FIG. 5 provides an illustration of the receiver board, according to an embodiment of the present invention.

In some embodiments, the transmission module 361 may be operably in communication with the receiver board 500. The receiver board 500 may include a processor 502, power management circuit 540, display 530, and a communication circuit 507, as shown in FIG. 5. The processor 502 may be operable to execute instructions sent from transmission module 361. The processor 502 may also control a display 530 operable to illustrate electrical characteristics 330. The processor 502 may be operable to execute program instructions 502B stored within memory 502A. Program instructions 502B may include a plurality of software modules operable to perform tasks such as Bluetooth communication, and power monitoring. These modules may include a receiving module 550 and a display module 560. The receiving module 550 may be operable to receive electrical characteristics 330 from transmission module 361 and perform post-processing.

The communication circuit 507 may allow the processor 502 to wirelessly communicate with controller board 300 and receive instructions. Examples of wireless communication provided by the communication circuit may include Wi-Fi, Bluetooth, Zigbee, LoRa, NFC, RFID, Cellular, and the like.

The power management system 540 may include a power source (not shown) operable to power receiver board 500. Examples of power source (not shown) may include a rechargeable battery, usb-power, DC power supplies, and the like.

In some exemplary embodiments, the receiver board 500 may be in communication with a mobile application operating on a client device 900. The mobile application may be operable to display identical information to the display 530. In such embodiments, the receiver board 500 may include a SIM card operable to increase the range of wireless communication. In some embodiments, the electrical characteristics 330 and tire characteristics 630 for a specific vehicle 10 and trailer 30 may be monitored by a fleet monitoring system 1000. The fleet monitoring system 1000 may be operable to monitor characteristics 330 and 630 for a plurality of vehicles 10 and trailers 30, thereby providing a system for monitoring the connection from an off-site location. The SIM card may allow the receiver board 500 to communicate electrical characteristics 330 and tire performance characteristics 630 to the fleet monitoring system 1000.

Embodiments of the present invention may include one or more USB charge ports for charging external electronic devices. Various electronic devices are compatible with USB charge ports via a USB cable (e.g., Standard A USB, Standard B USB, Mini A USB, Mini B USB, Micro A USB, Micro B USB, Micro AB USB, 30-pin Apple device ports, 8-pin Apple device ports, UC-E6 plug, Nokia Pop-Port, HTC ExtMicro USB port, etc.). However, some devices (e.g., older cell mobile phone technologies, computers, etc.) may not be USB compatible or the user of the system may not have a USB adapter cable available for an external device. Thus, in some implementations, the system may alternatively or additionally include power outlets and charge ports of various designs (e.g., 12V vehicle charger, etc.).

Figure 11:
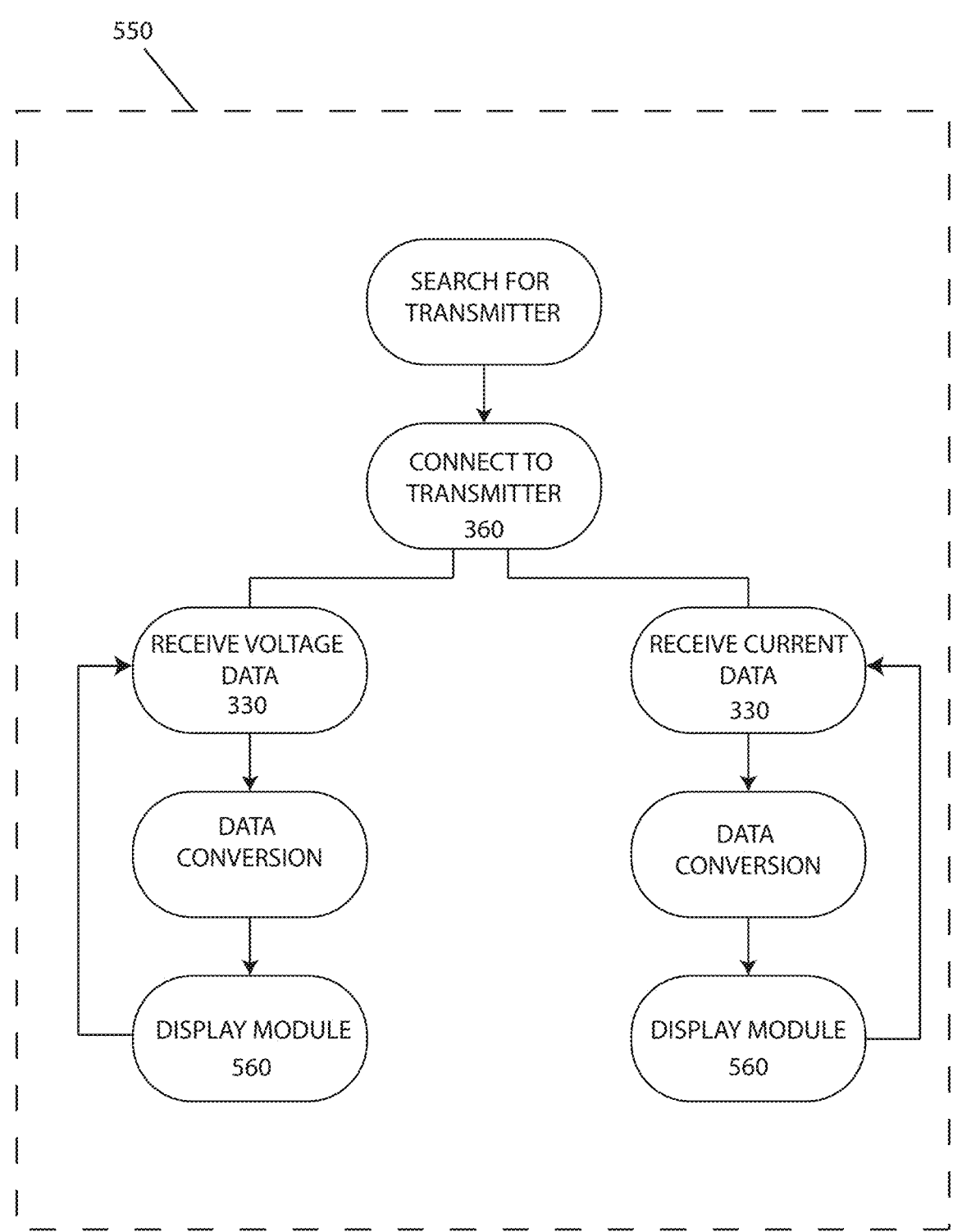
FIG. 11 provides a third flow diagram of the electrical connector and monitoring system, according to an embodiment of the present invention.

The receiving module 550 may be operably in communication with the transmission module 361 of the controller board 300, as shown in FIG. 11. The receiving module 550 may search for the communication circuit 360 on controller board 300. Once the communication circuit 360 is found, the receiving module 550 receives electrical characteristics 330 and converts them to a format readable by the display module 560. Data formats readable by the display module 560 may include bitmap, JPEG, PNG, pixel data, and the like.

In some embodiments, the display module 560 may be in communication with the receiving module 550. The display module 560 may be operable to display electrical characteristics 330 on a graphical user interface 531 of a display 530. In such embodiments, the electrical characteristics 330 may be presented in a plurality of formats including textual displays, graphical displays, and the like.

Figure 8:
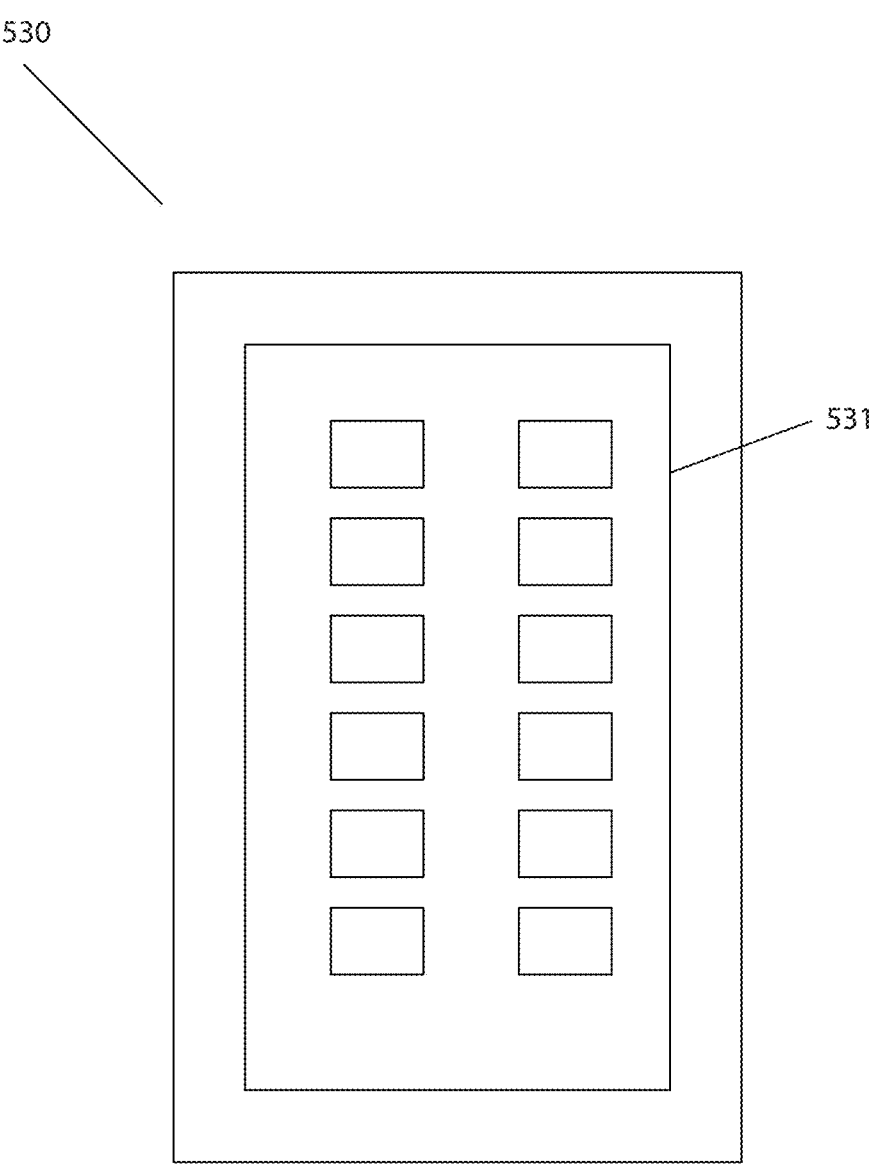
FIG. 8 provides an illustration of the display, according to an embodiment of the present invention.

The display 530, as shown in FIG. 8, may incorporate a Graphical User Interface 531 operable to display electrical characteristics 330. In such embodiments, the graphical user interface may be operable to display the status of loads between vehicle plug 11 and trailer plug 31, thereby indicating if a connection is stable or if a connection is faulty. The Graphical User Interface 531 may also be configured by the user to display an LED array 400 through a menu bar on the display module 501.

In some exemplary embodiments, the display module 560 may communicate with the TPMS system 600. The display module 560 may be operable to configure the display 530 for a specific vehicle 10 type. For example, there may be a plurality of vehicles 10 operably configured to interact with TPMS system 600 including passenger cars, light trucks, commercial trucks, recreational vehicles, agricultural vehicles, and the like. Therefore, the display module 560 may be operable to allow users to adjust the vehicle 10 configuration, trailer 30 configuration, trailer 30 pins within receptacle 30a, and the amount of tires 15 on vehicle 10 or tires 35 on vehicle 30.

Tire Monitoring System

Figure 6:
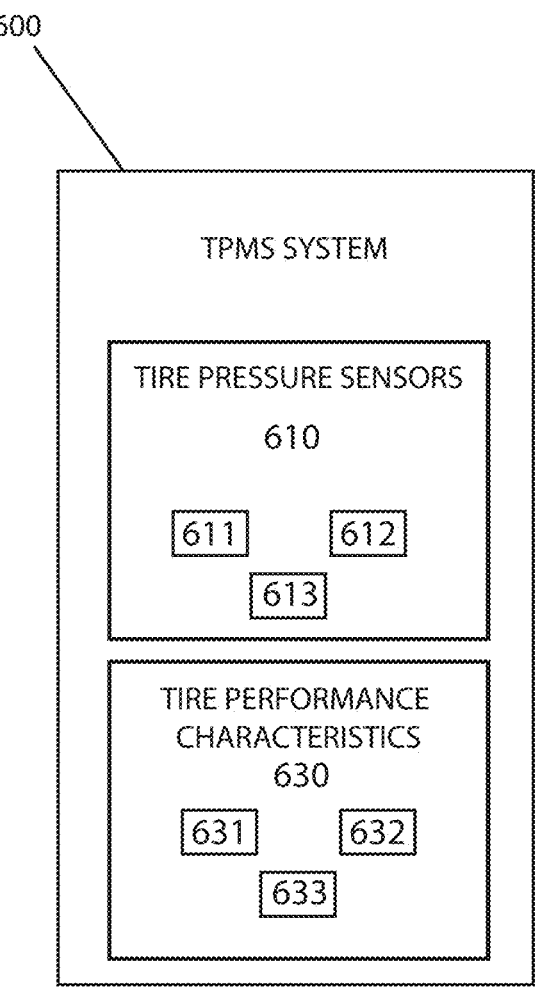
FIG. 6 provides an illustration of the tire monitoring system, according to an embodiment of the present invention.

In some embodiments, the junction box 100 may be in communication with a TPMS system 600. As shown in FIG. 6, the TPMS system 600 may include a plurality of tire pressure sensors 610, each with a processor 611, battery 612, and a communication system 613 (e.g., antenna, BT, BLE, etc.). Tire pressure sensors 610 may be mounted to the valve stem of tires 15 for vehicles 10 or tires 35 of trailers 30. In other embodiments, the tire pressure sensor 610 may be an internal tire pressure sensor that is integrated into the valve of the tire.

The processor 611 of each tire pressure sensor 610 may be operable to broadcast tire performance characteristics 630 using communication system 613. The communication system 613 may enable wireless communication using Bluetooth protocols through processor 611. For example, the processor 611 may broadcast the performance characteristics 630 using Bluetooth Low Energy (BLE) communication protocols.

The performance characteristics 630 of sensor 610 may include a plurality of characteristics describing both the sensor 610, vehicle tires 15 and trailer tires 35. For example, the performance characteristics 630 may include tire pressures 631, tire temperatures 632, and sensor battery life 633. In such embodiments, the performance characteristics 630 may be organized as a sequence of bytes, where each byte defines a specific characteristic from the sensor 610.

Figure 13:
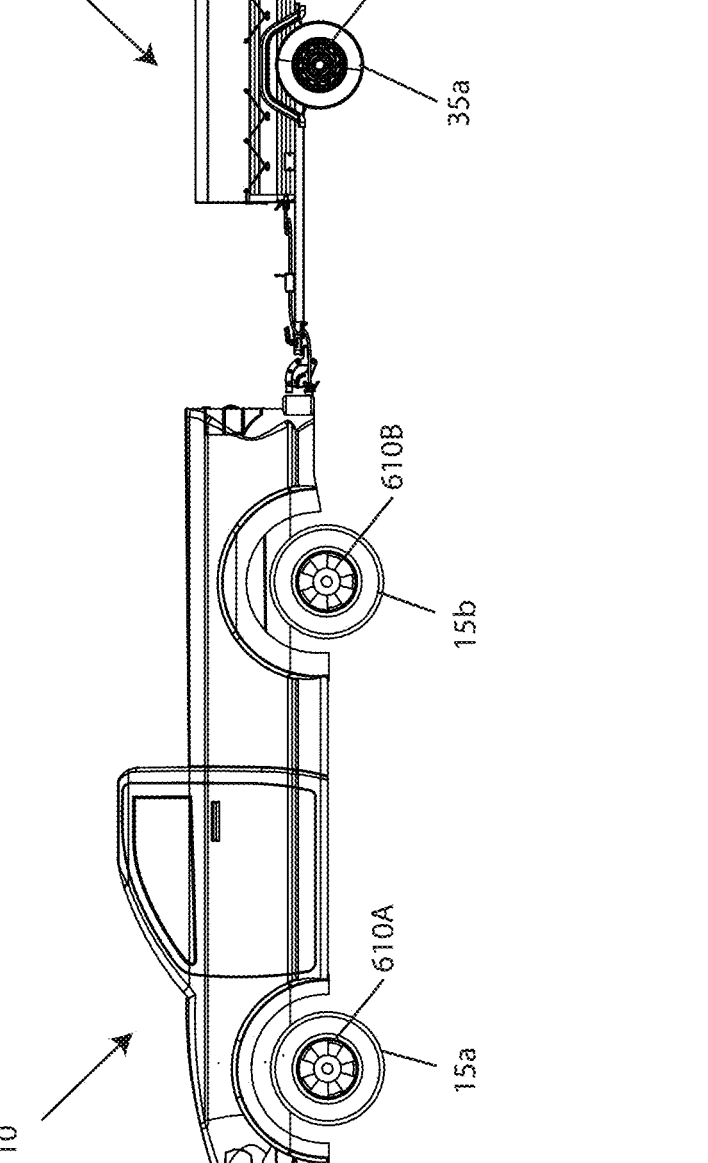
FIG. 13 provides a first environmental view of the electrical connector incorporated into a vehicle and a trailer, according to an embodiment of the present invention.
Figure 14:
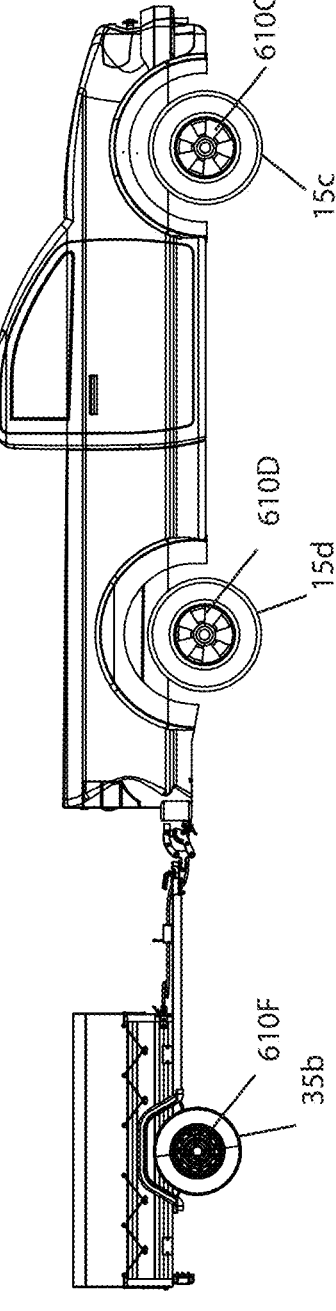
FIG. 14 provides a second environmental view of the electrical connector incorporated into a vehicle and a trailer, according to an embodiment of the present invention.

In some embodiments, there may be a tire pressure sensor 610 for each tire 15 on vehicle 10 and each tire 35 on trailer 30, as shown in FIGS. 13-14. For example, a truck or standard vehicle 10 may have four tires 15A-15D, and a tow hauler may have two tires 35A-35B, thereby requiring the use of six pressure sensors 610A-F. In other embodiments, there may be a plurality of tire pressure sensors 610 placed on a plurality of tires 15 of a vehicle 10 and a plurality of tires 35 on a trailer 30.

In some embodiments, the junction box 100 may include an LED array 400 operable to illuminate in case of any fault in connection status from a load within harness 12. Any single LED within LED array 400 may illuminate in case of a short circuit, open circuit, or a closed circuit. For example, if a short circuit is detected, a single LED may light up and continue to stay illuminated until the fault is corrected. The processor 301 of the controller board 300 may be operable to display the state of a single load within harness 12 to the corresponding LED inside LED array 400 within the junction box 100. In other embodiments, the microcontroller 301 may be operable to control a plurality of LEDs inside LED array 400, thereby generating a plurality of color patterns and displays.

In some embodiments, the LEDs in LED array 400 are electrically connected in a sequential manner, such that each LED in the array 400 is connected to the adjacent LED, forming a chain-like configuration. The connection scheme enables a smooth and uninterrupted propagation of light, creating a visually appealing effect where the light appears to flow seamlessly along the vertical array of LEDs. LED array 400 may be operable to produce a spectrum of colors. In some embodiments, LED array 400 may consist of RGB LEDs, high-power LEDs, SMD LEDs, infrared LEDs, OLEDs, or miniature LEDs. Each LED within LED array 400 may vary in voltage or power, and may be more cost-effective than others. For example, RGB LEDs are more commonly used due to low power consumption, increased efficiency, and relatively low costs. In some embodiments, the LED array 400 may emit a different wavelength of light.

Server and Fleet Monitoring

In some embodiments, the controller board 300 may be in communication with a server 700. The server may include a memory 710, a processor 720, a database 730, and the like. The memory 710 of the server may be operable to store program instructions 711 operably executable by processor 720.

The server 700 may serve as the central hub for data processing and storage within the system. The server may receive electrical characteristics 330 from the controller board 300, process this data using its processor 720, and store the results in the database 730. The server 700 can also facilitate firmware updates and configuration changes for the controller board 300, ensuring the system remains up-to-date and operates optimally. In such embodiments, the server 700 may also be in communication with the receiver board 500.

The database 730 on the server 700 may be designed to store comprehensive user data, including but not limited to user profiles, electrical characteristic 330 preferences, and LED array 400 configurations. The database 1730 may also store configuration settings, firmware updates, and other system-related information to ensure the seamless operation of the electrical connector and monitoring system 100.

In some embodiments, program instructions 711 may be operable to execute a trailer monitoring platform 800 operable to be implemented as a computer program product (e.g. software application, mobile application, web application, mobile app) operating on a client device 900. Client device 900 may include program instructions operably stored on a computer-readable medium.

Examples of a client device 900 may include a smartphone, tablet, computer, or any electronic device with a processor operable to execute program instructions.

In some embodiments, users 910 may be operable to access the platform 800 on their client device to monitor their electrical connector and the electrical and tire pressure characteristics. In other embodiments, users 910 may be operable to access the fleet monitoring system 1000 using platform 800 on client device 900.

In some embodiments, there may be a fleet monitoring system 1000 operable to remotely monitor a plurality of vehicles in the fleet allowing for a server manager to monitor the electrical characteristics 330 and the tire pressure characteristics of each user having a vehicle equipped with the electrical connector 20 of the present invention. The fleet monitoring system 1000 may track and analyze a plurality of electrical characteristics 330 such as voltage, current, and signal integrity across a plurality of vehicles in real-time. By collecting data from the junction box 100 system, the system 1000 can provide comprehensive oversight of the entire fleet's electrical health and performance. In some embodiments, the junction box may further record GPS data, accelerometer velocity, gyroscopic data, and the like.

Figure 15:
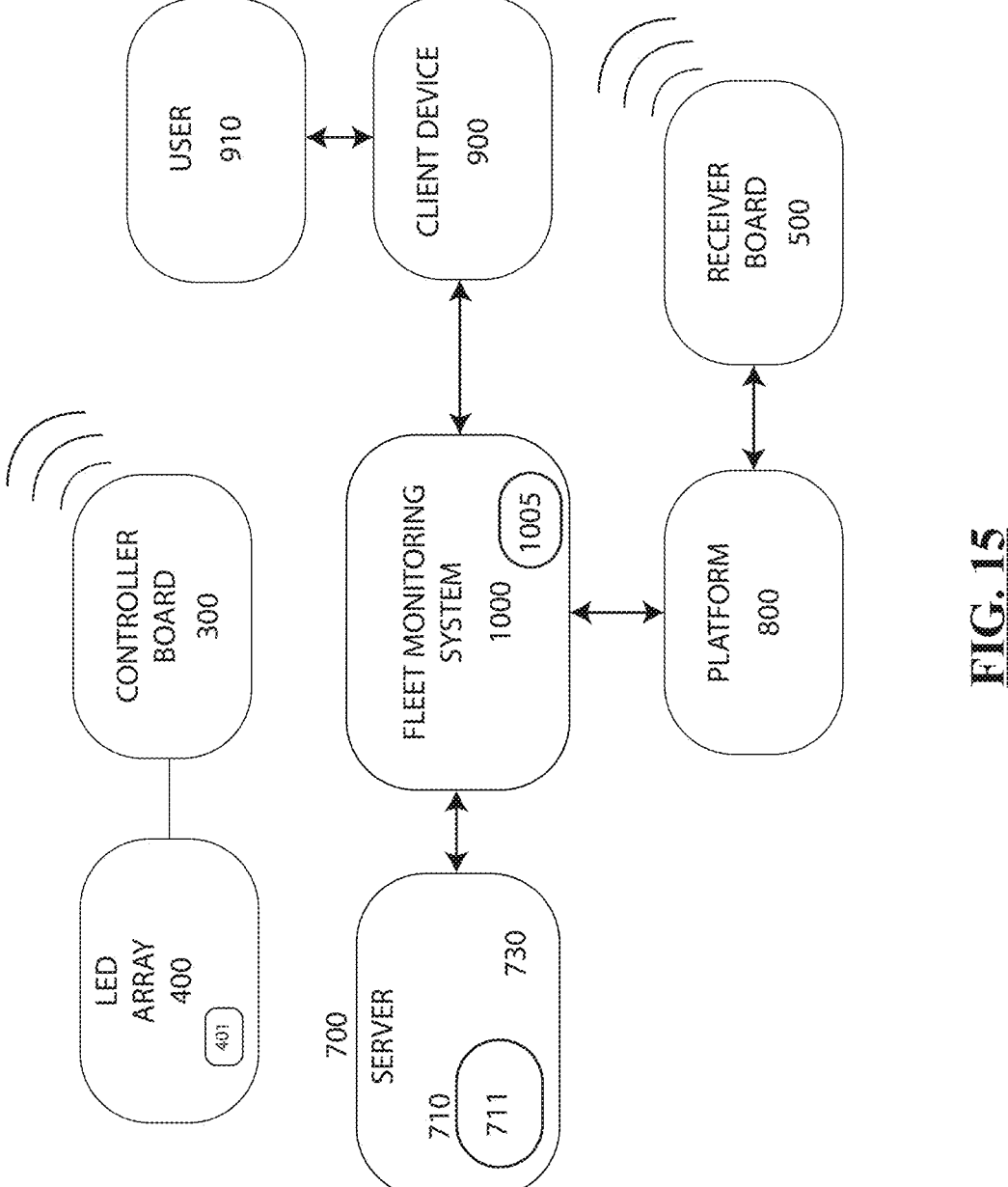
FIG. 15 provides an illustration of a fleet monitoring system, according to an embodiment of the present invention.

The fleet monitoring system 1000 may utilize wireless communication protocols to transmit data from each junction box 100 to a central server 700 or control unit, as shown in FIG. 15. This server 700 can process and store the data, allowing fleet managers to access detailed reports and diagnostics via a user interface. The system 1000 may alert operators to any anomalies or faults in the electrical systems, facilitating proactive maintenance and reducing the risk of breakdowns. The system 1000 may also be in communication with platform 800 operating on client device 900. In such embodiments, the controller board 300 may be equipped with wireless communication via a sim card 110 to transmit data to the server 700. In other implementations, the receiver board 500 may have a sim card to communicate information to the server 700 or the receiver board 500 or junction box 100 may be in communication with a client device 90 (e.g., cell phone) to transmit data to the server, or a combination of each may be used.

Additionally, the fleet monitoring system 1000 may support data logging and historical analysis, enabling long-term performance tracking and trend analysis. This can help in optimizing the operational efficiency of the fleet, ensuring compliance with safety regulations, and improving overall reliability. The integration of such a monitoring system 1000 can significantly enhance the management and operational capabilities of large vehicle fleets, particularly in industries reliant on trailer-based transportation.

In some embodiments, the server 700 may include robust data security measures to ensure the privacy and integrity of the data collected from the controller board 300 and other connected devices. This includes encryption of data during transmission and storage, secure access controls, and regular security audits to prevent unauthorized access and data breaches. User data and system configurations are encrypted using industry-standard algorithms, and access to the server 700 is restricted to authorized personnel only. The fleet monitoring system 1000 may be equipped with a real-time alert and notification system. This system provides immediate notifications to fleet managers and operators about critical issues such as electrical faults, tire pressure anomalies, and other performance-related problems. Alerts can be sent via SMS, email, or through the mobile application on the client device 900, ensuring timely intervention to prevent potential breakdowns or safety hazards.

In some embodiments, the fleet monitoring system 1000 may be designed to integrate seamlessly with other fleet management and enterprise systems. This includes integration with GPS tracking systems, logistics management software, and enterprise resource planning (ERP) systems. The integration capabilities ensure that all relevant data is consolidated into a single platform, providing a comprehensive view of the fleet's operations and enabling better decision-making.

In some embodiments, a primary electronic system 100, or junction box 100 may be in communication with the secondary electronic system 300, or the controller board 300. In such embodiments, the controller board 300 may be electrically connected to the junction box 100. Controller board 300 may also be in communication with a third electronic system 500 and a fourth electronic system 600. The third electronic system 500 may be operable to receive incoming electrical characteristics from controller board 300, and the fourth electronic system 600 may be operable to send tire performance characteristics 630 to controller board 300. The junction box 100 may be positioned between a vehicle 10 and trailer 30, operable to measure the electrical characteristics of loads traveling between vehicle plug 11 and trailer plug 31.

It is to be understood that variations, modifications, and permutations of embodiments of the present invention, and uses thereof, may be made without departing from the scope of the invention. It is also to be understood that the present invention is not limited by the specific embodiments, descriptions, or illustrations or combinations of either components or steps disclosed herein. The embodiments were chosen and described in order to best explain the principles of the invention and its practical application, to thereby enable others skilled in the art to best utilize the invention and various embodiments with various modifications as are suited to the particular use contemplated. Although reference has been made to the accompanying figures, it is to be appreciated that these figures are exemplary and are not meant to limit the scope of the invention. It is intended that the scope of the invention be defined by the claims appended hereto and their equivalents.

What is claimed is:

1. An electrical connector integrating a power management system and connector for a trailer to a vehicle, said electrical connector comprising:
   a. a primary electronic system connected between a vehicle and a trailer, said primary electronic system having:
      i. a plurality of pins electrically connected to an electrical wiring of a vehicle,
      ii. a plurality of fuses within a fuse block connected to a trailer plug connected to said vehicle electrical wiring, and
         wherein said plurality of pins are each connected to said plurality of fuses within said fuse block;
   b. a secondary electronic system in electrical communication with said primary electronic system and having a transmitter, a processor, and a sensory circuit that is operable to monitor a plurality of electrical characteristics of said plurality of pins; and
   c. a receiver having a display module and being in communication with said transmitter, and operable to receive said plurality of electrical characteristics;
   wherein said primary electronic system and secondary electronic system are connected between a vehicle and a trailer, and are operable to independently monitor said electrical characteristics of a load corresponding to each pin in said plurality of pins.

2. The electrical connector of claim 1, further comprising a tire pressure monitoring system in communication with said secondary electronic system, said tire pressure monitoring system comprising:

a. a plurality of tire pressure sensors, each having a processor, a battery, and an antenna; and b. a tire pressure module in communication with said processor that is operable to collect performance characteristics of the corresponding tire.

3. The electrical connector of claim 2, wherein said plurality of fuses are each operable to blow if current within a pin of said plurality of pins exceeds a predetermined threshold.

4. The electrical connector of claim 3, wherein said plurality of electrical characteristics includes current measurements between said plurality of pins and said trailer plug and voltage measurements at said plurality of pins.

5. The electrical connector of claim 4, further comprising a voltage monitoring system operable to measure voltage at said plurality of pins and a current monitoring system operable to measure current between said plurality of pins and said trailer plug, each after sampling a plurality of time samples and each reading being transmitted between said transmitter and said receiver.

6. The electrical connector of claim 5, wherein said display module includes a graphical user interface operable to receive input from a user of said trailer hitch adapter, wherein said graphical user interface is configurable to display said plurality of electrical characteristics.

7. The electrical connector of claim 6, wherein said performance characteristics includes tire pressure data, tire temperature data, and sensor battery life.

8. The electrical connector of claim 7, wherein said secondary electronic system includes a SIM card operable to transmit data via a cellular network.

9. The electrical connector of claim 8, wherein said secondary electronic system may be in communication with a mobile application operating on a client device or a remote server.

10. The electrical connector of claim 9, wherein said secondary electronic system is in communication with a fleet monitoring system operable to monitor said plurality of electrical characteristics for a plurality of primary electronic systems connected between a plurality of vehicles and a plurality of trailers using said remote server.

11. A method of monitoring the electrical connection between a vehicle and a trailer, the method comprising:

a. inserting a vehicle plug of an electrical connector into a vehicle receptacle, said vehicle plug having a plurality of pins connected to a junction box, said junction box comprising:

i. a controller board having a processor and antenna, ii. a protection circuit, and iii. a sensory circuit having a current monitoring system and a voltage monitoring system, said sensory circuit being in electrical communication with said controller board;

b. inserting a trailer plug of said electrical connector into a trailer receptacle, said trailer plug having a plurality of pins connected to said junction box, wherein each pin of said plurality of pins corresponds to a function on said trailer;

c. placing a receiver board in the cabin of said vehicle, said receiver board including a processor and a display module having a graphical user interface; and d. a wireless connection between said receiver board and said controller board.

12. The method of claim 11, further comprising an electrical monitoring system operable to measure a plurality of electrical characteristics between said vehicle plug and said trailer plug, said electrical monitoring system comprising:

a. a plurality of sensors, each being electrically connected to said processor of said controller board;

b. a transmission module in communication with said processor being operable to transmit said plurality of electrical characteristics from said controller board to said receiver board.

13. The method of claim 12, wherein said processor is operable to establish said wireless connection using a transmission module.

14. The method of claim 13, wherein said controller board is in communication with a mobile application operating on a client device.

15. The method of claim 14, said plurality of electrical characteristics having current readings and voltage readings, each reading generated by sampling over a plurality of time samples.

16. A junction box configured to attach a trailer electrical system to a vehicle electrical system, the electrical connector comprising:

a. a harness having a plurality of wires connected to a vehicle electrical system on a first end and connected to a trailer electrical system on a second end, wherein each of said wires corresponds to an electrical load;

b. a protection circuit operable to independently protect each electrical load in said harness;

c. a sensory circuit operable to monitor electrical characteristics of said each electrical load independently, said sensory circuit further in communication with a controller having a processor; and d. a receiver in wireless communication with said controller, said receiver including a display and graphical user interface that is operable to display said electrical characteristics establishing wherein said harness is in electrical communication with a fuse block and said processor is operable to communicate with said sensory circuit and said sensory circuit is operable to monitor electrical characteristics at said harness, and said controller is operable to send said electrical characteristics to said receiver using a wireless communication protocol.

17. The junction box of claim 16, further comprising a tire pressure monitoring system in communication with said controller, said tire pressure monitoring system including a plurality of tire pressure sensors, each having a processor, a battery, and an antenna, wherein said controller includes a tire pressure module in communication with said sensor processor that is operable to collect performance characteristics of the corresponding tire.

18. The junction box of claim 17, wherein said electrical characteristics includes current measurements.

19. The junction box of claim 18, wherein said receiver is in electrical communication with a remote server.

20. The junction box of claim 16, wherein said server is in communication with a fleet management system that is operable to monitor a plurality of junction boxes connected to a plurality of vehicles.

* * * * *